US012446291B2

(12) United States Patent
Chanemougame et al.

(10) Patent No.: US 12,446,291 B2
(45) Date of Patent: Oct. 14, 2025

(54) INVERTED TOP-TIER FET FOR MULTI-TIER GATE-ON-GATE 3-DIMENSION INTEGRATION (3Di)

(71) Applicant: TOKYO ELECTRON LIMITED, Tokyo (JP)

(72) Inventors: Daniel Chanemougame, Albany, NY (US); Lars Liebmann, Albany, NY (US); Jeffrey Smith, Albany, NY (US); Paul Gutwin, Albany, NY (US); Xiaoqing Xu, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 626 days.

(21) Appl. No.: 17/542,024

(22) Filed: Dec. 3, 2021

(65) Prior Publication Data

US 2022/0271033 A1    Aug. 25, 2022

Related U.S. Application Data

(60) Provisional application No. 63/151,166, filed on Feb. 19, 2021.

(51) Int. Cl.
*H10D 84/01* (2025.01)
*H01L 21/02* (2006.01)
(Continued)

(52) U.S. Cl.
CPC ..... *H10D 84/0186* (2025.01); *H01L 21/0259* (2013.01); *H01L 23/5286* (2013.01);
(Continued)

(58) Field of Classification Search
CPC ............ H01L 27/0922; H01L 21/0259; H01L 21/823807; H01L 21/823871;
(Continued)

(56) References Cited

U.S. PATENT DOCUMENTS 1,201,148 A    10/1916  Chittenden
9,331,071 B2 *  5/2016  Sunamura ......... H01L 29/78618
(Continued)

OTHER PUBLICATIONS

International Search Report and Written Opinion issued Apr. 1, 2022 in PCT/US2021/063473, 11 pages.
(Continued)

*Primary Examiner* — Eduardo A Rodela
(74) *Attorney, Agent, or Firm* — Oblon, McClelland, Maier & Neustadt, L.L.P.

(57) ABSTRACT

Aspects of the present disclosure provide a multi-tier semiconductor structure. For example, the multi-tier semiconductor structure can include a first semiconductor device tier that includes first semiconductor devices. A first signal wiring structure can be formed over and electrically connected to the first semiconductor device tier. An insulator layer can be formed over the first signal wiring structure. A second semiconductor device tier can be formed over the insulator layer, the second semiconductor device tier including second semiconductor devices. A second signal wiring structure can be formed over and electrically connected to the second semiconductor device tier. An inter-tier via can be formed vertically through the insulator layer and electrically connecting the second signal wiring structure to the first signal wiring structure. The first semiconductor device tier, the second semiconductor device tier and the inter-tier via can be formed monolithically.

18 Claims, 10 Drawing Sheets

(51) Int. Cl.
*H01L 23/528* (2006.01)
*H10D 30/01* (2025.01)
*H10D 30/67* (2025.01)
*H10D 62/10* (2025.01)
*H10D 84/03* (2025.01)
*H10D 84/85* (2025.01)
*H10D 88/00* (2025.01)

(52) U.S. Cl.
CPC ....... *H10D 30/031* (2025.01); *H10D 30/6735* (2025.01); *H10D 30/6757* (2025.01); *H10D 62/118* (2025.01); *H10D 84/0167* (2025.01); *H10D 84/038* (2025.01); *H10D 84/856* (2025.01)

(58) Field of Classification Search
CPC ............. H01L 23/5286; H01L 29/0665; H01L 29/42392; H01L 29/66742; H01L 29/78696; H01L 27/0688; H01L 27/0694; H01L 27/0886; H01L 27/0924; H01L 2027/11868; H01L 2027/11883; H01L 2027/11887; H01L 2027/11888; H01L 23/481; H01L 23/49827; H01L 23/49838; H01L 23/50; H01L 23/535; H01L 23/5283; H10D 84/856; H10D 30/031; H10D 30/6735; H10D 30/6757; H10D 62/118; H10D 84/0167; H10D 84/0186; H10D 84/038; H10D 30/43; H10D 62/121; H10D 88/00; H10D 84/85; B82Y 10/00

See application file for complete search history.

(56) References Cited

U.S. PATENT DOCUMENTS

| | | | |
|---|---|---|---|
| 9,355,892 B2* | 5/2016 | Shih | H01L 25/16 |
| 9,941,275 B2* | 4/2018 | Or-Bach | H01L 23/3677 |
| 10,049,979 B2* | 8/2018 | Farooq | H01L 23/481 |
| 10,121,743 B2* | 11/2018 | Kamal | H01L 23/5286 |
| 10,276,439 B2* | 4/2019 | Engelmann | H01L 25/0657 |
| 10,651,153 B2 | 5/2020 | Fastow et al. | |
| 10,826,492 B2* | 11/2020 | Dubey | H01L 25/0657 |
| 10,833,078 B2 | 11/2020 | Smith et al. | |
| 10,867,678 B2 | 12/2020 | Chen et al. | |
| 10,937,766 B2 | 3/2021 | Liu | |
| 10,984,862 B2 | 4/2021 | Liu | |
| 11,024,600 B2 | 6/2021 | Liu | |
| 11,031,377 B2 | 6/2021 | Liu | |
| 11,056,454 B2 | 7/2021 | Liu | |
| 11,056,463 B2* | 7/2021 | Takahashi | H01L 27/146 |
| 11,127,719 B2* | 9/2021 | Greco | H01L 23/481 |
| 11,489,009 B2* | 11/2022 | Wu | H10B 61/22 |
| 11,688,757 B2* | 6/2023 | Tsugawa | H01L 27/1463 257/431 |
| 11,721,628 B2* | 8/2023 | Kim | H01L 23/5286 257/382 |
| 2009/0014891 A1* | 1/2009 | Chang | H01L 24/24 257/E23.068 |
| 2009/0042365 A1* | 2/2009 | McDonald | H01L 25/50 438/459 |
| 2010/0225002 A1* | 9/2010 | Law | H01L 23/481 257/E21.597 |
| 2011/0186936 A1* | 8/2011 | Iwamatsu | H01L 25/0657 257/E21.627 |
| 2013/0135004 A1* | 5/2013 | Hashimoto | H01L 22/10 438/15 |
| 2016/0133546 A1* | 5/2016 | Yang | H01L 23/481 257/751 |
| 2017/0317061 A1 | 11/2017 | Takahashi et al. | |
| 2018/0108607 A1 | 4/2018 | Farooq et al. | |
| 2019/0043836 A1 | 2/2019 | Fastow et al. | |
| 2019/0172828 A1 | 6/2019 | Smith et al. | |
| 2019/0341394 A1* | 11/2019 | Hasegawa | H10B 41/27 |
| 2020/0027509 A1 | 1/2020 | Chen et al. | |
| 2020/0076424 A1 | 3/2020 | Dubey et al. | |
| 2020/0135718 A1 | 4/2020 | Liebmann et al. | |
| 2020/0328176 A1 | 10/2020 | Liu | |
| 2020/0328180 A1 | 10/2020 | Cheng et al. | |
| 2020/0328181 A1 | 10/2020 | Liu | |
| 2020/0328186 A1 | 10/2020 | Liu | |
| 2020/0328188 A1 | 10/2020 | Liu | |
| 2020/0328190 A1 | 10/2020 | Liu | |
| 2020/0350014 A1 | 11/2020 | Liu | |
| 2020/0350286 A1 | 11/2020 | Cheng et al. | |
| 2020/0350287 A1 | 11/2020 | Liu | |
| 2020/0350320 A1 | 11/2020 | Cheng et al. | |
| 2020/0350321 A1 | 11/2020 | Cheng et al. | |
| 2020/0350322 A1 | 11/2020 | Liu | |
| 2021/0028112 A1 | 1/2021 | Kim et al. | |
| 2021/0028169 A1 | 1/2021 | Smith et al. | |
| 2021/0151413 A1 | 5/2021 | Liu | |
| 2021/0151414 A1 | 5/2021 | Liu | |
| 2021/0175211 A1 | 6/2021 | Liu | |
| 2021/0210142 A1 | 7/2021 | Liu | |
| 2021/0265319 A1 | 8/2021 | Liu | |
| 2023/0065446 A1* | 3/2023 | Cheng | H01L 27/1266 |

OTHER PUBLICATIONS

Korean Office Action issued Apr. 11, 2025 in Korean Patent Application No. 10-2023-7023527 (with English translation), 21 pages.

* cited by examiner

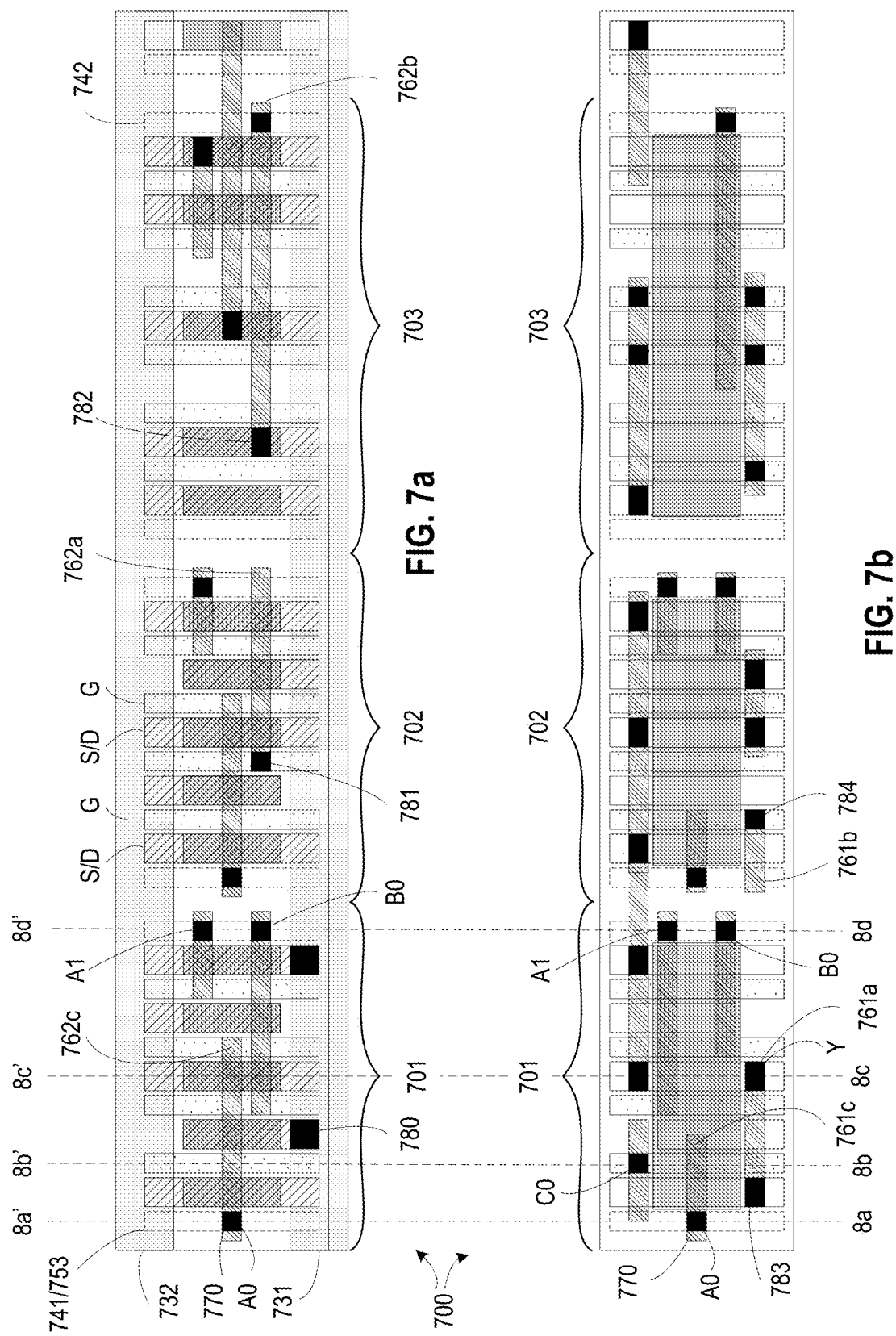

INVERTED TOP-TIER FET FOR MULTI-TIER GATE-ON-GATE 3-DIMENSION INTEGRATION (3Di)

INCORPORATION BY REFERENCE

This present disclosure claims the benefit of U.S. Provisional Application No. 63/151,166, entitled "Inverted top-tier FET for multi-tier gate-on-gate 3Di" filed on Feb. 19, 2021, which is incorporated herein by reference in its entirety.

FIELD OF THE PRESENT DISCLOSURE

The present disclosure relates generally to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, which has enabled the integration of heterogeneous functional circuits, such as logic and memory circuits, onto the same semiconductor substrate. However, 2D scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other as another means of further scaling of integrated circuits (ICs).

SUMMARY

Aspects of the present disclosure provide a multi-tier semiconductor structure. For example, the multi-tier semiconductor structure can include a first semiconductor device tier that includes first semiconductor devices. A first signal wiring structure can be formed over and electrically connected to the first semiconductor device tier. An insulator layer can be formed over the first signal wiring structure. In an embodiment, the insulator layer can include a silicon-on-insulator (SoI) layer. A second semiconductor device tier can be formed over the insulator layer, the second semiconductor device tier including second semiconductor devices. A second signal wiring structure can be formed over and electrically connected to the second semiconductor device tier. An inter-tier via can be formed vertically through the insulator layer and electrically connecting the second signal wiring structure to the first signal wiring structure. In an embodiment, the first semiconductor device tier, the second semiconductor device tier and the inter-tier via can be formed monolithically.

For example, the inter-tier via can be formed in a diffusion break region that vertically isolates neighboring ones of the second semiconductor devices. As another example, the second semiconductor device tier can include a dummy poly, and the inter-tier via can be aligned with the dummy poly.

In an embodiment, the multi-tier semiconductor structure can further include a substrate and the first semiconductor device tier can be formed over the substrate. For example, the multi-tier semiconductor structure can further include a first power rail that is buried in the substrate and electrically connected to the first semiconductor device tier. As another example, the multi-tier semiconductor structure can further include a second power rail that is formed over the second semiconductor device tier and electrically connected to the second semiconductor device tier.

In an embodiment, the first semiconductor devices can be vertically stacked over one another and/or the second semiconductor devices can be vertically stacked over one another. For example, the second semiconductor devices can include field effect transistors (FETs).

In an embodiment, the multi-tier semiconductor structure can further include a contact that is vertically formed to electrically connect the second semiconductor device tier to the second signal wiring structure. In another embodiment, the multi-tier semiconductor structure can further include a contact that is formed vertically through the insulator layer to electrically connect the second semiconductor device tier to the first signal wiring structure. For example, the contact can include a gate contact that electrically connects a gate region of one of the second semiconductor devices of the second semiconductor device tier to the first signal wiring structure. As another example, the contact can include a source/drain contact that electrically connects a source/drain region of one of the second semiconductor devices of the second semiconductor device tier to the first signal wiring structure.

Aspects of the present disclosure further provide method of fabricating a multi-tier semiconductor structure. For example, the method can include forming a first semiconductor device tier, the first semiconductor device tier including first semiconductor devices. The method can further include forming a first signal wiring structure over the first semiconductor device tier and electrically connecting the first signal wiring structure to the first semiconductor device tier, and forming an insulator layer over the first signal wiring structure. In an embodiment, the insulator layer can include an SoI layer. The method can further include forming a second semiconductor device tier over the insulator layer, the second semiconductor device tier including second semiconductor devices. The method can further include forming a second signal wiring structure over the second semiconductor device tier and electrically connecting the second signal wiring structure to the second semiconductor device tier, and forming an inter-tier via vertically through the insulator layer to electrically connect the second signal wiring structure to the first signal wiring structure. In an embodiment, the first semiconductor device tier, the second semiconductor device tier and the inter-tier via are formed monolithically.

In an embodiment, forming an inter-tier via can include forming an inter-tier via in a diffusion break region that vertically isolates neighboring ones of the second semiconductor devices. For example, the second semiconductor device tier can include a dummy poly, and the inter-tier via is aligned with the dummy poly.

In an embodiment, the method can further include forming a contact vertically through the insulator layer to electrically connect the second semiconductor device tier to the first signal wiring structure.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIGS. 7a and 7b show top and bottom views (or layout representations) of an exemplary multi-tier semiconductor structure of FIG. 7c, respectively, in accordance with some embodiments of the present disclosure;

DETAILED DESCRIPTION

Figure 1:
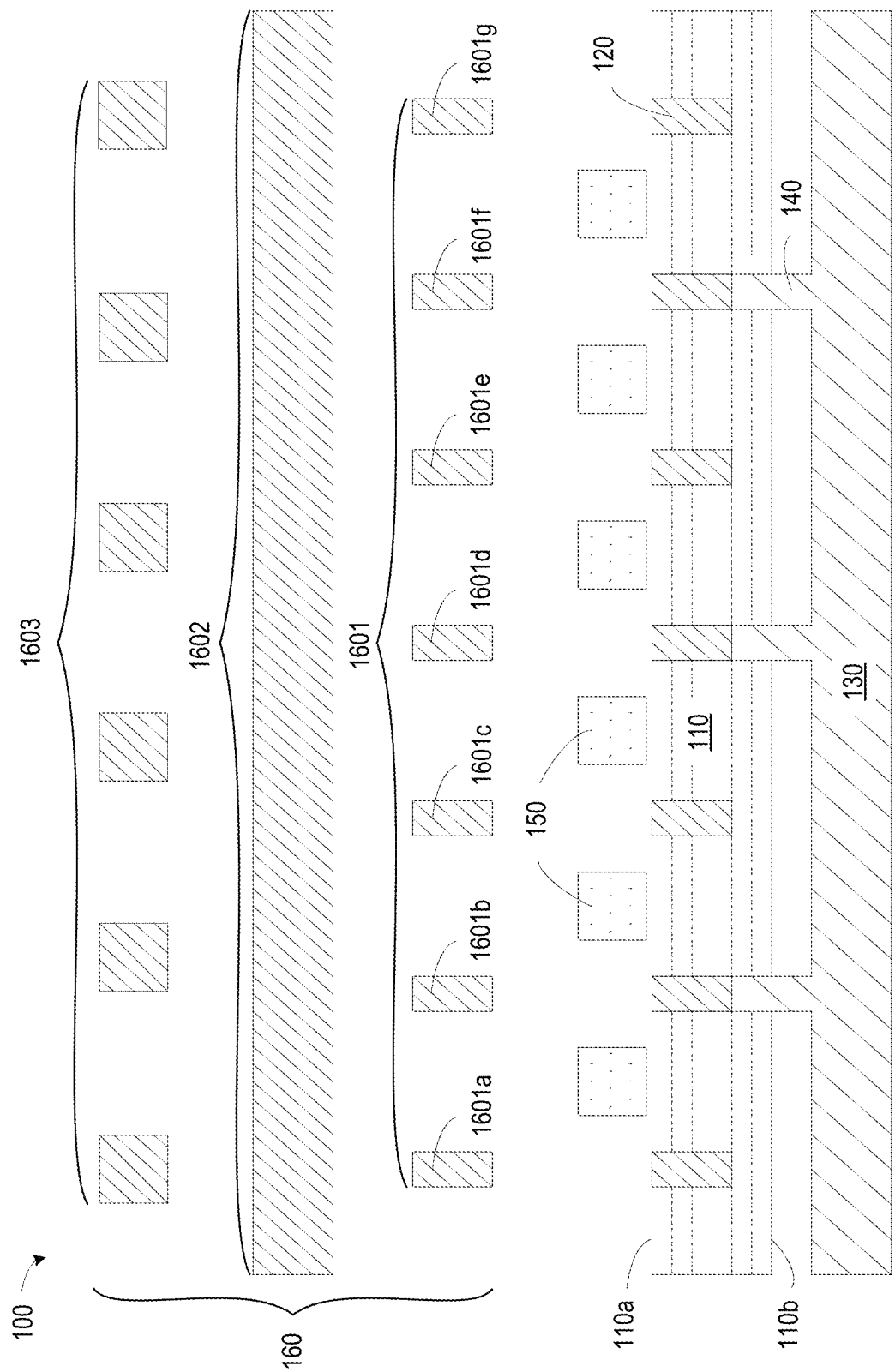
FIG. 1 shows a simplified cross-sectional view of a semiconductor segment.

The word "exemplary" is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus (or device) in use or operation in addition to the orientation depicted in the figures. The apparatus (or device) may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of the present disclosure, it is intended that each of the concepts can be executed independently of each other or in combination with each other. Accordingly, the present disclosure can be embodied and viewed in many different ways.

As noted in the Background, semiconductor device fabricators have expressed a desire for three-dimensional (3D) semiconductor devices in which transistors are stacked on top of each other as another means of scaling ICs, in addition to conventional 2D scaling. A 3D integration (3Di), i.e., the vertical stacking of semiconductor devices, aims to overcome 2D scaling limitations by increasing transistor density in volume rather than area. Although device stacking has been successfully demonstrated and implemented by the flash memory industry with the adoption of 3D NAND, application to random logic designs is substantially more difficult. 3D integration for logic chips such as central processing units (CPUs), graphics processing units (GPUs), field programmable gate arrays (FPGAs) and system on a chip (SoC) is being pursued primarily by two approaches: one approach is heterogeneous stacking, and the other approach is more of a homogeneous stacking.

Heterogeneous stacking uses wafer/chip stacking and through silicon via (TSV) technology, as disclosed in Process Integration Aspects enabling 3D sequential stacked planar and FINfet Technology, Anne VanDooren, IMEC PTW Spring 2018. For example, in this 3D integration approach two chips can be optimized in design and manufacturing for different specific tasks, e.g., one containing chemical and biological sensors, the other including nanodevices and micro-electromechanical system (MEMS) devices, and TSVs can be used to integrate these two different functional chips to build a stacked SoC. Details of heterogeneous integration approaches are provided in the Heterogeneous Integration Roadmap, 2019 edition published October 2019 at http://eps.ieee.org/hir.

Homogeneous stacking uses a wafer bonding process to overcome density loss associated with micron-sized TSVs that are used in heterogeneous stacking. For example, a base wafer can be processed to form devices such as n-type metal oxide semiconductors (nMOSs) and p-type MOSs (pMOSs), and several layers of metallization/wiring, and then a thinned silicon-on-insulator (SOI) layer can be positioned on top of the base wafer and bonded thereto by way of an oxide-oxide bond to form a completed structure.

FIG. 1 shows a simplified cross-sectional view of a semiconductor segment 100. A substrate (or a wafer) 110, e.g., a silicon or SiGe substrate, can be provided. A tier of semiconductor devices (or a semiconductor device tier) 150 can be disposed on a front side 110a of the substrate 110. For example, the tier of semiconductor devices 150 can include one or more semiconductor devices, such as field effect transistors (FETs), that form a functional circuit, such as a logic circuit or a memory circuit. Further, these FETs can be n-type or p-type FETs that are arranged along the front side 110a or stacked vertically over one another along the thickness direction of the substrate 110.

One or more power rails 120 can be buried in the substrate 110 and electrically connect the tier of semiconductor devices 150 to a power delivery network (PDN) 130 by way of TSVs (e.g., nano-scale) 140 to provide low voltage (Vss) and high voltage (VDD) power delivery, for example, from the PDN 130 to the tier of semiconductor devices 150. The PDN 130 can be formed on a back side 110b of the substrate 110.

A signal wiring structure (or a wiring tier) 160 can be disposed over the tier of semiconductor devices 150 and used to electrically connect the tier of semiconductor devices 150 to, for example, another tier of semiconductor devices (not shown) disposed over the wiring tier 160. The wiring tier 160 can include one or more wiring layers (or wiring levels), with each wiring layer including one or more wiring tracks that extend in a direction along the front side 110a of the substrate 110. Generally, wiring tracks in one wiring layer will run in a direction perpendicular to the direction of wiring tracks in an adjacent wiring layer. For example, the wiring tier 160 can include three wiring layers 1601, 1602 and 1603, and the wiring layer 1601 can include seven wiring tracks 1601a to 1601g that extend in a direction (e.g., perpendicular to the plane of the drawing page) perpendicular to the direction of wiring tracks in the wiring layer 1602 along the front side 110a of the substrate 110.

Figure 2:
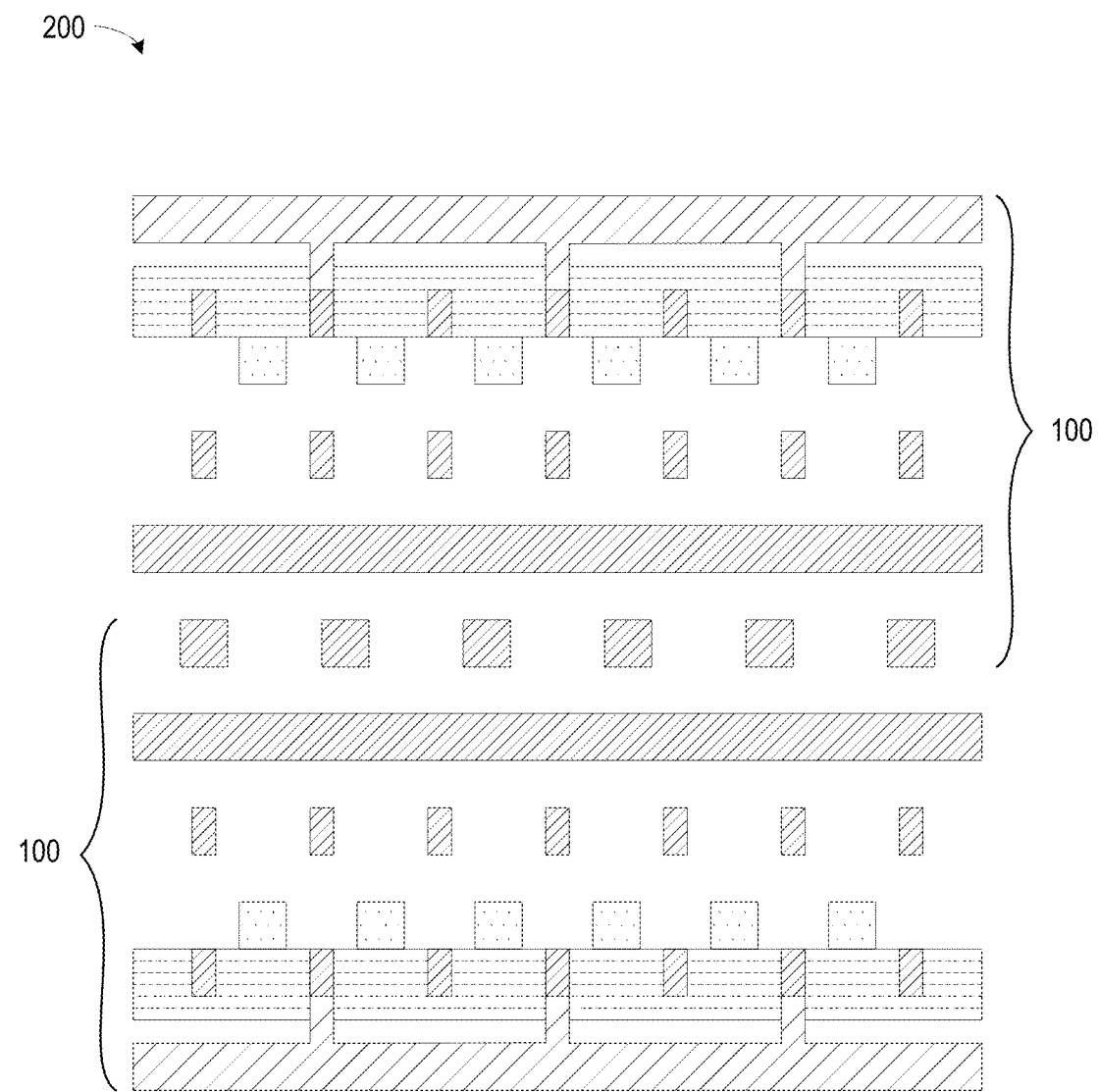
FIG. 2 shows a semiconductor structure that includes two semiconductor segments fabricated in face-to-face 3D integration (3Di)

FIG. 2 shows a semiconductor structure 200 that includes two semiconductor segments fabricated in face-to-face 3D integration (3Di), that is, a multi-tier stack of semiconductor devices with a high-density of inter-tier wiring for efficient logic-to-memory or logic-to-logic connections. FIG. 2 shows the final outcome that the present disclosure is aiming at. These two semiconductor segments can be built separately, and each semiconductor segment can include power distribution, semiconductor devices (such as FETs) and a signal wiring structure. For example, the semiconductor structure 200 can include two of the semiconductor segments 100 shown in FIG. 1 that are vertically stacked over each other by flipping one upside down, and each of the semiconductor segments 100 can include the power distribution (e.g., the power rails 120, the PDN 130 and the TSVs 140), the semiconductor devices (e.g., the tier of semiconductor devices 150), and the signal wiring structure (e.g., the signal wiring structure 160). In the face-to-face 3Di fabrication, these two separately built semiconductor segments 100 are carefully aligned to each other and bonded together face-to-face at bonding sites (not shown) by face-to-face bonds. Generally, one of the semiconductor segments 100 can include TSVs that lead to bumps (not shown) disposed on the top of the semiconductor segment 100, which are used to connect the semiconductor structure 200 to its package, as described in detailed at https://spectrum.ieee.org/tech-talk/semiconductors/processors/globalfoundries-arm-close-in-on-3d-chip-integration.

Figure 3:
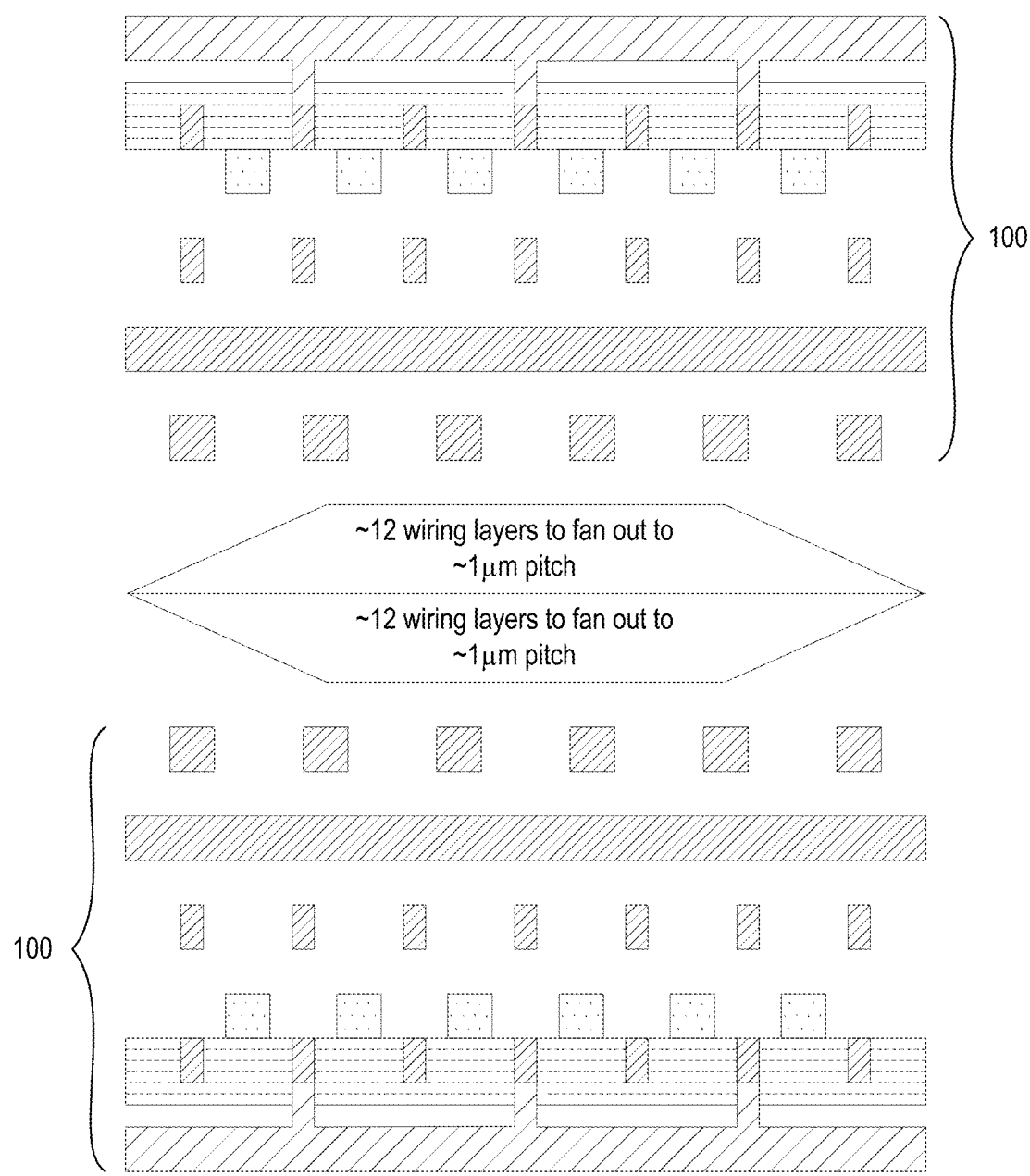
FIG. 3 shows a semiconductor structure that includes two semiconductor segments fabricated in face-to-face 3Di.

FIG. 3 shows a semiconductor structure 300 that includes two semiconductor segments fabricated in face-to-face 3Di. It can be seen that the face-to-face bonding can require a relatively tall (or thick) wire stack (i.e., a large number of wiring layers) to gradually expand the wiring pitch to the large values required to meet the overlay requirements of face-to-face bonding (e.g., 12 wiring layers to fan out to 1 µm pitch). In the process, this gradual expansion leads to a significant increase of area used that defeats the initial purpose of density gains sought after by face-to-face 3Di. Therefore, this face-to-face 3Di approach is not a true monolithic integration because independently processed wafers or wafer segments are stacked on top of each other, and cannot offer a true scaling solution for semiconductor fabrication.

To achieve overlay tolerances compatible with dense inter-tier wiring, sequential 3Di (also referred to by some as monolithic 3Di) is needed.

Figure 4:
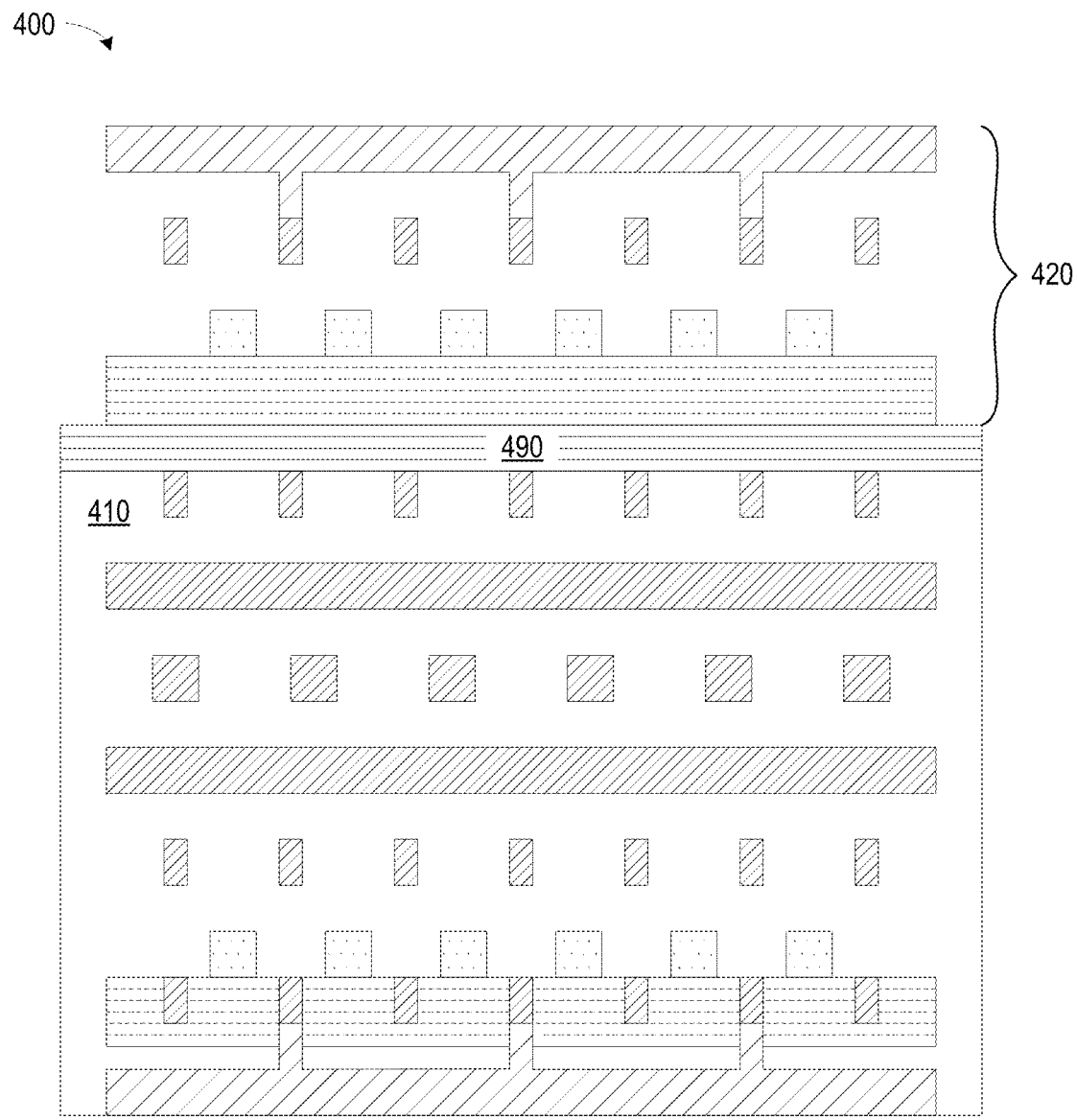
FIG. 4 shows a semiconductor structure that includes two semiconductor segments fabricated in a sequential 3Di process.

FIG. 4 shows a semiconductor structure 400 that includes two semiconductor segments fabricated in a sequential 3Di process. In the sequential 3Di process, a complete bottom tier 410 (which can be similar to the semiconductor segment 100) can be built in the beginning, then a silicon on insulator (SoI) layer 490 can be bonded to the top of the bottom tier 410, and finally a top tier 420, which can also include power distribution, semiconductor devices (such as FETs) and a signal wiring structure, can be built over the SoI layer 490. For example, in CoolCube™, which is a sequential 3Di process pioneered by CEA-Leti (more information can be found at https://en.wikipedia.org/wiki/Three-dimensional_integrated_circuit), the complete bottom tier 410 can be built at a thermal budget reaching 1,000° C., then the SoI layer 490 can be bonded to the top of the bottom tier 410, and finally the top tier 420 can be built over the SoI layer 490 at another thermal budget less than 600° C., e.g., 500° C., which is far lower than 1,000° C. This lower thermal budget can ensure that the performance of the bottom tier 410 is not degraded while the top tier 420 is fabricated and the intrinsic performance of the top tier 420 is not reduced. A major advantage of this sequential 3Di process is the near perfect alignment of the top tier 420 to the existing bottom tier 410. This can be achieved by lithographic alignment through the thinned SoI layer 490.

Figure 5:
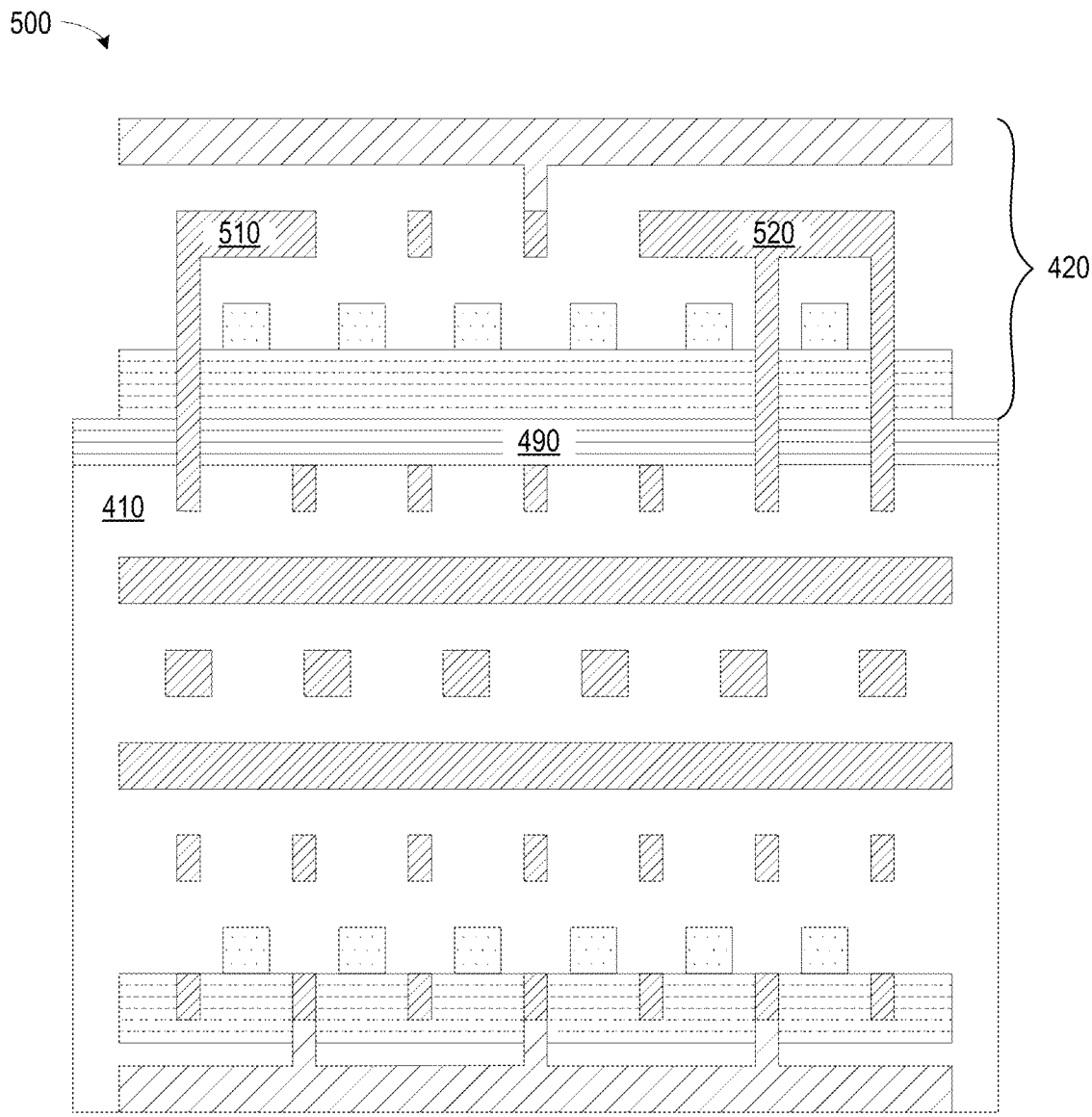
FIG. 5 shows a semiconductor structure that includes two semiconductor segments fabricated in a sequential 3Di process.

FIG. 5 shows a semiconductor structure 500 that includes two semiconductor segments fabricated in a sequential 3Di process, e.g., the bottom tier 410 and the top tier 420 shown in FIG. 4. As shown, a challenge in the sequential 3Di process is connection, e.g., 510 and 520, between the top tier 420 and the bottom tier 410. For example, running top-tier signals laterally to inter-tier vias can result in blocking space and reducing achievable device density on the top tier 420. Thus, connectivity density directly competes with the device density of the top tier 420.

The present disclosure relates to dense 3Di, in particular to gate-on-gate (GoG) 3Di, more specifically to GoG 3Di implemented in sequential (aka monolithic) 3Di with dense nano-scale connectivity (as distinguished from micron-scale connectivity achievable with face-to-face bonding). Embodiments herein can also be applicable to an inverted transistor architecture configured to exploit the dense connectivity in sequential 3Di. This is beneficial because the semiconductor industry is moving to 3Di and terminology is becoming more conventional.

Techniques herein include a top semiconductor device tier and standard cell architecture that enables dense inter-tier connectivity while maintaining dense top semiconductor device tier placement by wiring all pin connections to a wiring tier below the top semiconductor device tier using a combination of bottom contacts and monolithic inter-tier vias (MIVs) running through diffusion break regions.

Figures 6A, 6B:
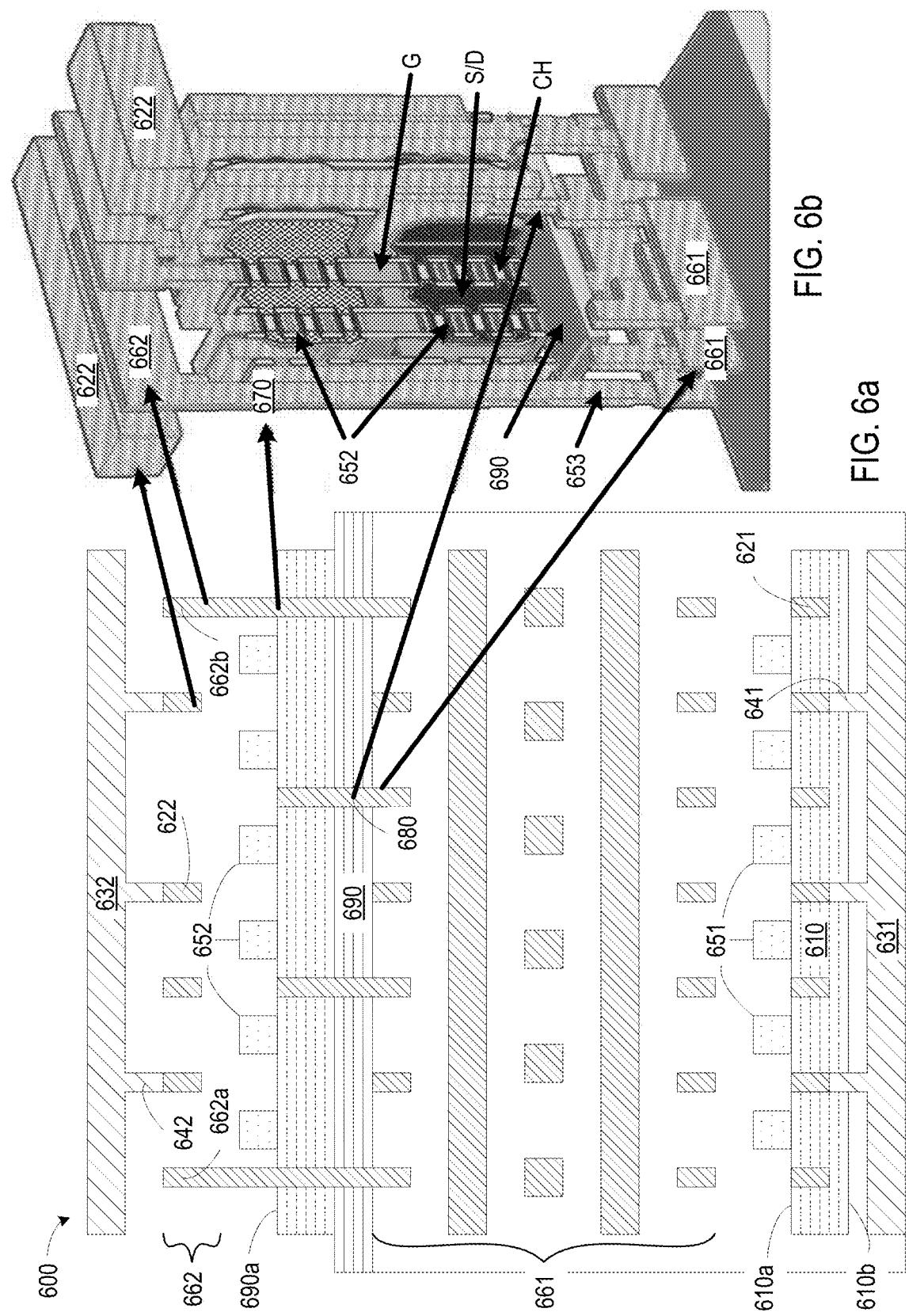
FIG. 6a shows a cross-sectional view of an exemplary multi-tier semiconductor structure of FIG. 6b in accordance with some embodiments of the present disclosure.
FIG. 6b shows a perspective view of the semiconductor structure in accordance with some embodiments of the present disclosure.

FIG. 6a shows a cross-sectional view of an exemplary multi-tier semiconductor structure 600, and FIG. 6b is a perspective view representing only the top-tier of the semiconductor structure 600, in accordance with some embodiments of the present disclosure. In an embodiment, the semiconductor structure 600 can include a substrate 610 (or a wafer) (not visible on FIG. 6b). For example, the substrate 610 can be a silicon or SiGe substrate. A first semiconductor device tier 651 can be disposed on a front side 610a of the substrate 610. For example, the first semiconductor device tier 651 can include one or more semiconductor devices, such as field effect transistors (FETs), that form a functional circuit, such as a logic circuit or a memory circuit. Further, these FETs can be n-type or p-type FETs (e.g., NMOSs and PMOSs) that are arranged along the front side 610a or stacked vertically over one another along the thickness direction of the substrate 610.

One or more first power rails 621 can be buried in the substrate 610 and electrically connect the first semiconductor device tier 651 to a first PDN 631 by way of first TSVs (e.g., nano-scale) 641 to provide low voltage (Vss) and high voltage (VDD) power delivery, for example, from the first PDN 631 to the first semiconductor device tier 651. The first PDN 631 can be formed on a back side 610b of the substrate 610.

A first signal wiring structure (or a first wiring tier) 661 can be disposed over the first semiconductor device tier 651 and used to electrically connect the first semiconductor device tier 651 to, for example, another semiconductor device tier (e.g., a second semiconductor device tier 652) disposed over the first wiring tier 661 or another signal wiring structure (e.g., a second signal wiring structure (or a second wiring tier) 662). Similar to the wiring tier 160 shown in FIG. 1, the first wiring tier 661 can also include one or more wiring layers (or wiring levels), with each wiring layer including one or more wiring tracks that extend in a direction along the front side 610a of the substrate 610. For example, the first wiring tier 661 can include five wiring layers, and the upmost, middle and bottommost ones can include seven, six and seven wiring tracks, respectively. Generally, wiring tracks in one wiring layer will run in a direction perpendicular to the direction of wiring tracks in an adjacent wiring layer. For example, the wiring tracks in the topmost wiring layer can extend in a direction (e.g., perpendicular to the plane of the drawing page) perpendicular to the direction of wiring tracks in a wiring layer right below the topmost wiring layer along the front side 610a of the substrate 610.

An insulator layer (or an SoI layer) 690 (indicated by the arrow but not shown for simplicity) can be formed over and bonded to the top of the first wiring tier 661. For example, the insulator layer 690 can include a thermal silicon oxide (SiO$_2$) layer.

The second semiconductor device tier 652 can be deposited and formed over a front side 690a of the insulator layer (or the SoI layer) 690. For example, the second semiconductor device tier 652 can include one or more semiconductor devices, such as FETs, that form a functional circuit, such as a logic circuit or a memory circuit. Further, these FETs can be n-type or p-type FETs that are arranged along the front side 690a of the insulator layer 690 or stacked vertically over one another along the thickness direction of the insulator layer 690. For example, these FETs can form a standard cell, e.g., an XOR or NAND logic cell, and include multiple lower p-type FETs and multiple upper n-type FETs stacked vertically over the lower p-type FETs to form complementary FETs (CFETs). Neighboring CFETs can be isolated by a diffusion break region 653 (indicated by the arrow but not shown for simplicity), which can provide a space which monolithic inter-tier vias (MIVs) 670 (described later) can go through. For example, the diffusion break region 653 can include double diffusion break (DDB) or single diffusion break (SDB). As another example, these FETs can be gate-all-around (GAA) or GAA nano-sheet (GAA NS) FETs that have source/drain regions S/D, gate regions G, and channel (or nano-channel) regions CH that are all surrounded by the gate regions G. Note that description herein focused on CFET and GAA devices for convenience, but it can be appreciated that techniques herein can be applied to other 3D device architectures.

The second signal wiring structure (or a second wiring tier) 662 can be disposed over the second semiconductor device tier 652 and used to electrically connect the second semiconductor device tier 651 to, for example, another semiconductor device tier (e.g., the first semiconductor device tier 651) and another signal wiring structure (e.g., the first signal wiring structure 661). Similar to the wiring tier 160 shown in FIG. 1, the second wiring tier 662 can include one or more wiring layers (or wiring levels), with each wiring layer including one or more wiring tracks that extend in a direction along the front side 690a of the insulator layer 690. For example, the second wiring tier 662 can include one wiring layer, and the wiring layer can include two wiring tracks 662a and 662b.

One or more second power rails 622 can be formed over the second semiconductor device tier 652 and electrically connect the second semiconductor device tier 652 to a second PDN 632 by way of second TSVs (e.g., nano-scale) 642 to provide low voltage (Vss) and high voltage (VDD) power delivery, for example, from the second PDN 632 to the second semiconductor device tier 652. Accordingly, the second semiconductor device tier 652 can include inverted top-tier FETs of the exemplary multi-tier semiconductor structure 600.

One or more monolithic inter-tier vias (MIVs) 670 can be formed to electrically connect the second wiring tier 662 to the first wiring tier 661. For example, the MIVs 670 can be aligned with a dummy poly and formed vertically through the diffusion break region 653 and the insulator layer 690 to electrically connect the second wiring tier 662 to the first wiring tier 661, without running top-tier signals laterally to inter-tier vias.

Further, one or more connections can be formed to electrically connect the second semiconductor device tier 652 to the first wiring tier 661. For example, the connections can include one or more bottom gate contacts 680 that are formed vertically through the insulator layer 690 to electrically connect the gate regions G of the lower FETs of the second semiconductor device tier 652 to the outside (e.g., the first wiring tier 661).

Figure 7C:
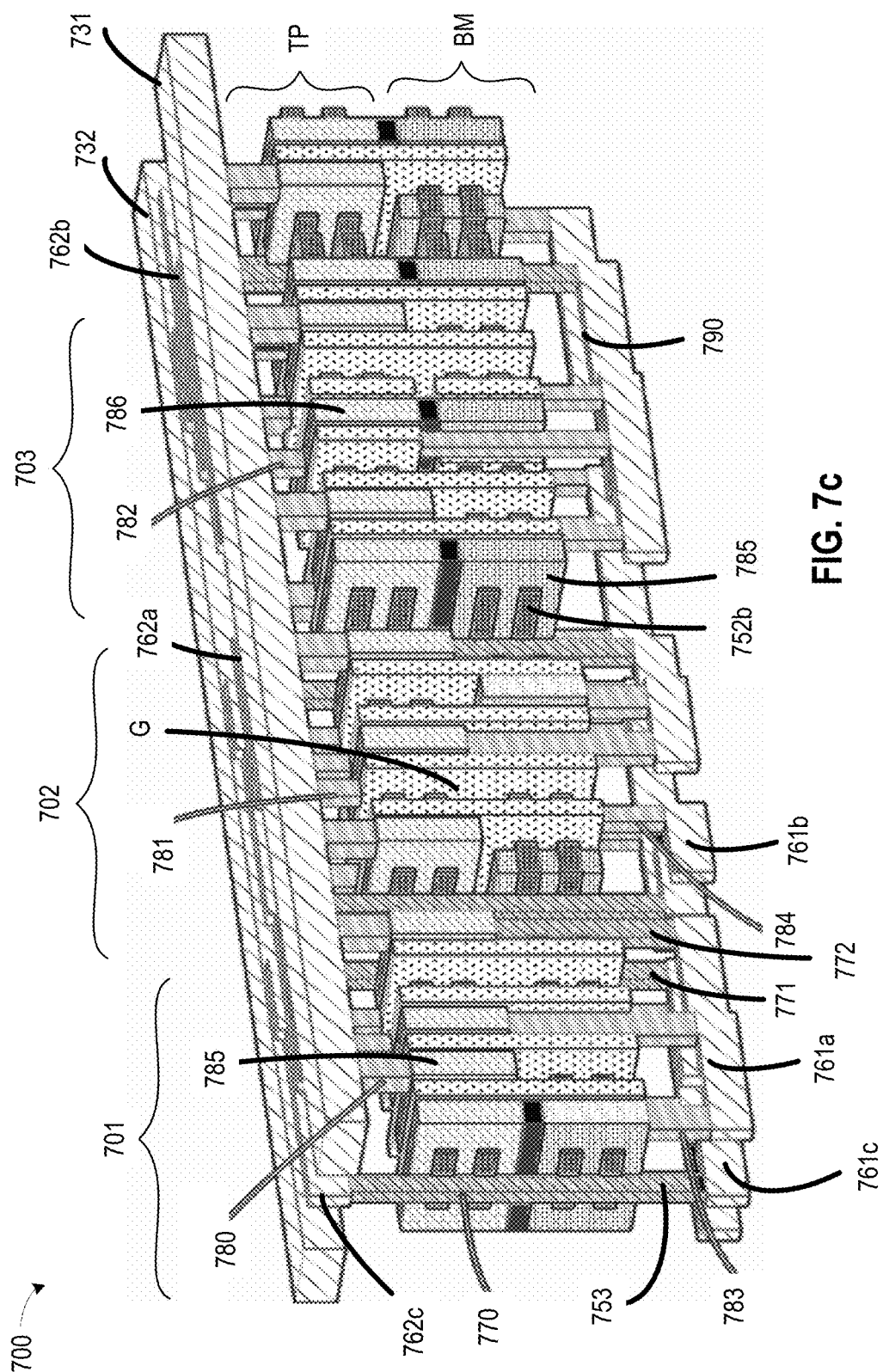
FIG. 7c shows a perspective view of the semiconductor structure in accordance with some embodiments of the present disclosure.

As shown in the example of FIG. 6b, the top-tier of the semiconductor structure 600 is represented and shows 1 level of wiring (e.g., the second wire tier 662) above the device plane and another level of wiring (e.g., the first wire tier 661) below the device plane. The level of wiring 661 represents the top of the bottom tier of the semiconductor structure 600. These 2 levels are represented in FIGS. 7a and 7b as top views (or layout representations) of an exemplary top-tier semiconductor structure 700 of FIG. 7c, which is a perspective view of the semiconductor structure 700, in accordance with some embodiments of the present disclosure. In an embodiment, the semiconductor structure 700 can include first to third gate-on-gate logic cells 701 to 703, with each logic cell including top and bottom semiconductor device tiers TP and BM. For example, the top and bottom semiconductor device tiers TP and BM can include the multiple upper n-type FETs and lower p-type FETs of the second semiconductor device tier 652 of the semiconductor structure 600, respectively. Each of the top and bottom semiconductor device tiers TP and BM can include multiple source/drain (S/D) tracks arranged alternately with multiple gate (G) tracks to form multiple FETs. These FETs can be p-type FETs or n-type FETs. For example, the FETs in the bottom semiconductor device tier BM can be p-type and the FETs in the top semiconductor device tier can be n-type to form CFETs. Each cell boundary can be formed by first and second top power tracks 731 and 732 and left and right poly gate tracks 741 and 742.

As shown in FIG. 7c as well as FIG. 7a, which shows a top view of the top semiconductor device tier TP of the semiconductor structure 700, a top power contact 780 can electrically connect the top semiconductor device tier TP of the first logic cell 701 to the second top power track 732 through a local interconnect 785, a top gate contact 781 can electrically connect the gate region G of the top semiconductor device tier TP of the second logic cell 702 to a first top wiring track 762a, and a top source/drain contact 782 can electrically connect the source/drain region S/D of the top semiconductor device tier TP of the third logic cell 703 to a second top wiring track 762b through a local interconnect 786. In an embodiment, the top power contact 780, the top gate contact 781 and the top source/drain contact 782 can be all vertically formed along the thickness direction of the semiconductor structure 700, and are further described in U.S. Provisional Application No. 63/085,583, entitled "Connections from Buried Interconnects to Device Terminals in Multiple Stacked Devices Structures" filed on Sep. 30, 2020, which is incorporated herein by reference in its entirety.

As shown in FIGS. 7a and 7c as well as FIG. 7b, which shows a bottom view of the bottom semiconductor device tier BM of the semiconductor structure 700, a monolithic inter-tier via (MIV) 770 can be formed vertically through the insulator layer 790 (not visible on FIG. 7c for clarity) to electrically connect a third top wiring track 762c to a third bottom wiring track 761c, a bottom source/drain contact 783 can electrically connect the source/drain region S/D of the bottom semiconductor device tier BM of the first logic cell 701 to a first bottom wiring track 761a, and a bottom gate contact 784 can electrically connect the gate region G of the bottom semiconductor device tier BM of the second logic cell 702 to a second bottom wiring track 761b. The first to third bottom wiring tracks 761a to 761c can be collectively referred to as a bottom wiring tier (or a first wiring tier), and the first to third top wiring tracks 762a to 762c can be collectively referred to as a top wiring tier (or a second wiring tier). In an embodiment, the MIV 770, the bottom source/drain contact 783 and the bottom gate contact 784 can be all vertically formed through the insulator layer 790 along the thickness direction of the semiconductor structure 700. For example, the MW 770 can be self-aligned with a dummy poly gate, e.g., the left poly gate track 741 of the first logic cell 701 and formed through a diffusion break region 753 that isolates neighboring CFETs.

Figure 8A:
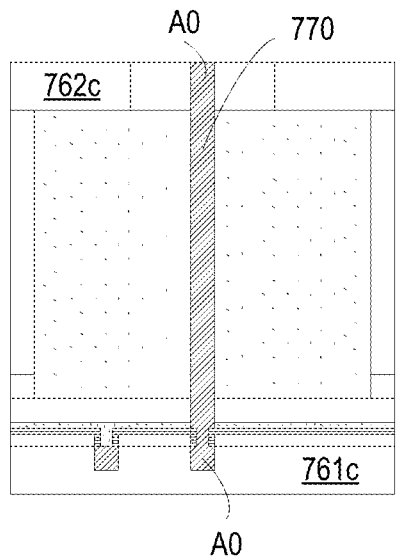
FIGS. 8a to 8d show cross-sectional views of the semiconductor structure shown in FIGS. 7a to 7c along lines 8a-8a', 8b-8b', 8c-8c' and 8d-8d' of FIGS. 7a and 7b, respectively, in accordance with some embodiments of the present disclosure.
Figure 8B:
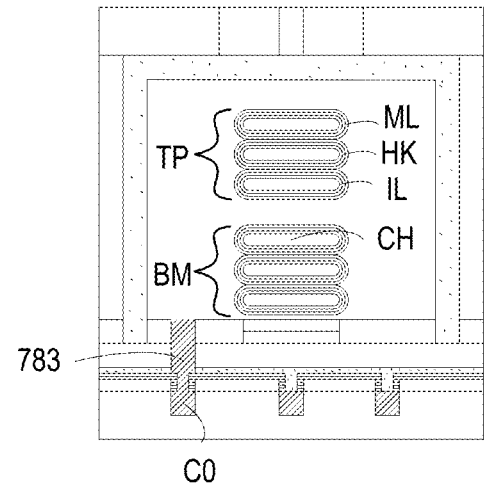
Figure 8C:
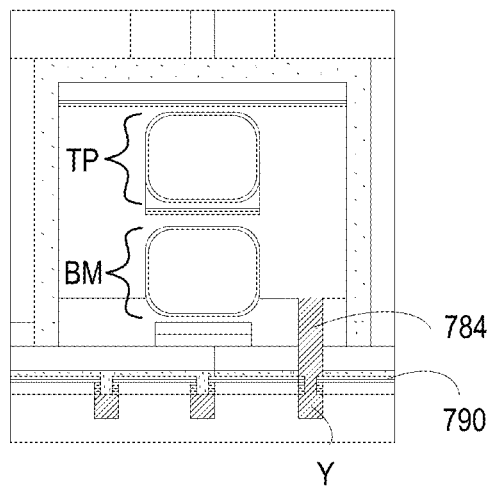
Figure 8D:
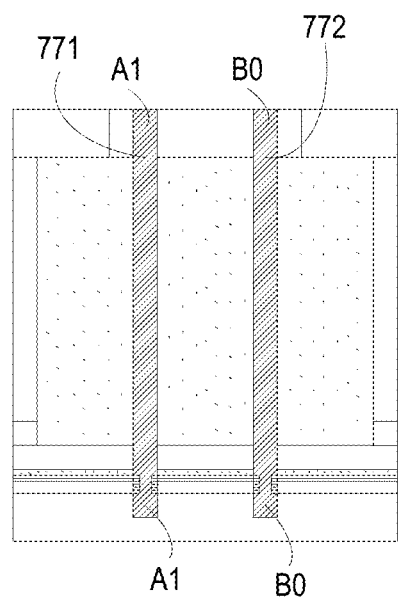

FIGS. 8a to 8d are cross-sectional views of the semiconductor structure 700 along lines 8a-8a', 8b-8b', 8c-8c' and 8d-8d' of FIGS. 7a and 7b, respectively, in accordance with some embodiments of the present disclosure. All pins (i.e., pieces of wiring structures that the inter-tier signal routing 661 connects into) can end up in the place below the top and bottom semiconductor device tiers TP and BM of the semiconductor structure 700. For example, a top pin A0 above the top semiconductor device tier TP can connect to the top semiconductor device tier TP of the semiconductor structure 700 and route to a corresponding bottom pin A0 below the bottom semiconductor device tier BM through the MIV 770, as shown in FIG. 8a, and top pins A1 and B0 above the top semiconductor device tier TP can connect to the top semiconductor device tier TP of the semiconductor structure 700 and route to corresponding bottom pins A1 and B0 below the bottom semiconductor device tier BM through MIVs 771 and 772, respectively, as shown in FIG. 8d. As another example, bottom pins C0 and Y can connect directly to the bottom semiconductor device tier BM of the semiconductor structure 700 through the bottom source/drain contact 783 and the bottom gate contact 784, as shown in FIGS. 8b and 8c, respectively. FIG. 8b further shows that gate dielectric materials can be deposited by selective deposition on the channel regions CH of the semiconductor devices of the top and bottom semiconductor device tiers TP and BM. For example, an interlayer IL and a high-k layer HK can be sequentially formed on the channel regions CH. FIG. 8b further shows that a metal layer ML can be deposited on the high-k layer HK. For example, the metal layer ML can include TiN, TaN or TiAl.

Figure 9:
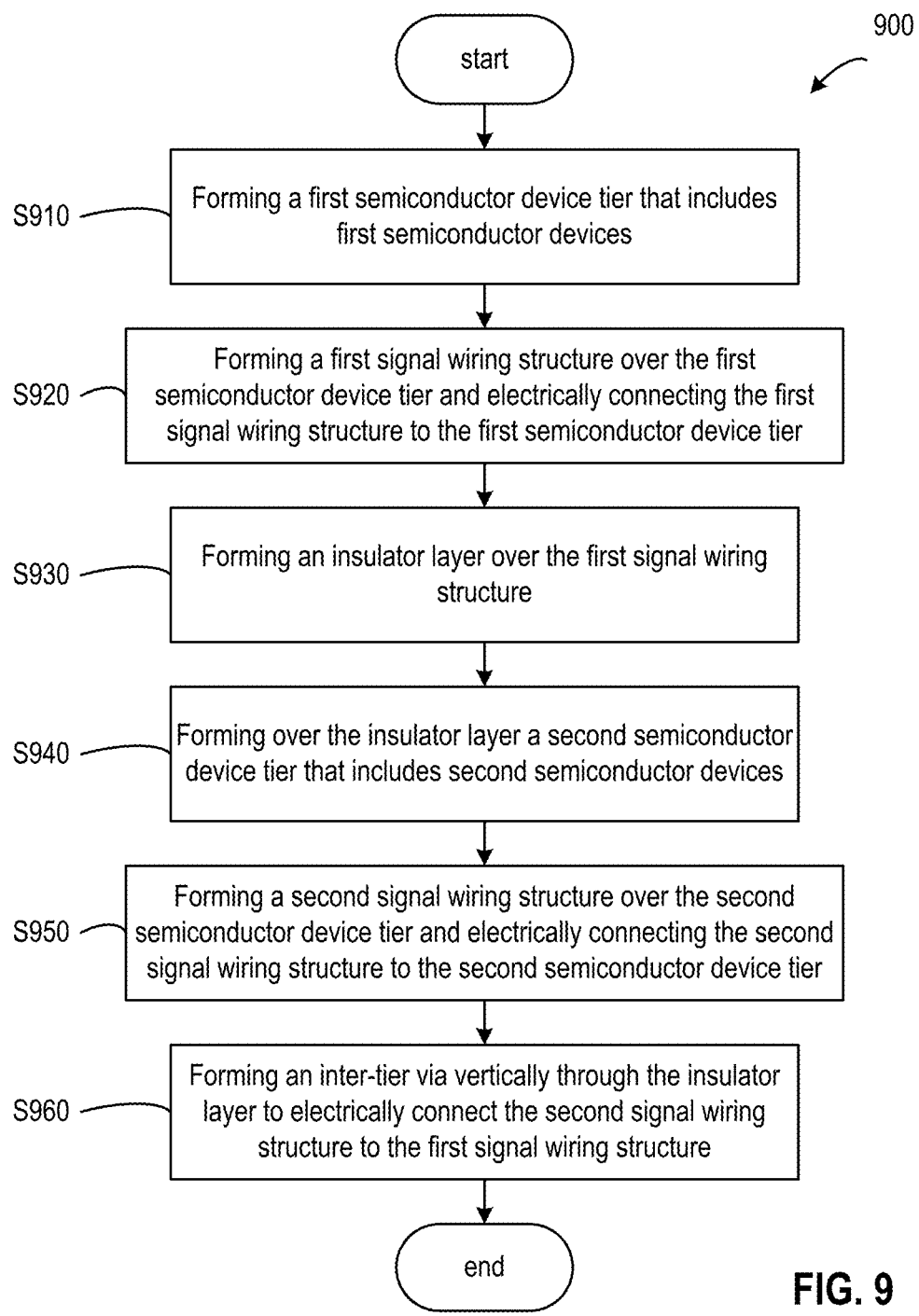
FIG. 9 is a flow chart illustrating an exemplary method of fabricating a multi-tier semiconductor structure in accordance with some embodiments of the present disclosure.

FIG. 9 is a flow chart illustrating an exemplary method 900 of fabricating a multi-tier semiconductor structure in accordance with some embodiments of the present disclosure. In an embodiment, some of the steps of the exemplary method 900 shown can be performed concurrently or in a different order than shown, can be substituted by other method steps, or can be omitted. Additional method steps can also be performed as desired. In another embodiment, the exemplary method 900 can correspond to the multi-tier semiconductor structures 600 and 700 shown in FIGS. 6a, 6b, 7a to 7c and 8a to 8d.

At step S910, a first semiconductor device tier that includes first semiconductor devices can be provided. For example, the first semiconductor device tier can include the first semiconductor device tier 651 of the semiconductor structure 600 shown in FIG. 6a. In an embodiment, the first semiconductor device tier can be formed over a front side of a substrate and receive power provided by a PDN disposed on a back side of the substrate through a power rail buried in the substrate. For example, the first semiconductor device tier 651 can be formed over the front side 610a of the substrate 610 and receive power provided by the first PDN 631 disposed on the back side 610b of the substrate 610 through the first power rail 621 buried in the substrate 610, as shown in FIG. 6a. The first semiconductor devices can include FETs, which can be n-type or p-type and be arranged along the front side 610a of the substrate 610 or stacked vertically over one another along the thickness direction of the substrate 610.

At step S920, a first signal wiring structure (or a first wiring tier) can be formed over and electrically connected to the first semiconductor device tier. For example, the first wiring tier 661 can be formed over and electrically connected to the first semiconductor device tier 651, as shown in FIG. 6a.

At step S930, an insulator layer (or an SoI layer) can be formed over the first signal wiring structure. For example, the insulator layer 690 can be formed over the first signal wiring structure 661, as shown in FIG. 6a. As another example, the insulator layer 790 can be formed over the first to third bottom wiring tracks 761a to 761c, as shown in FIG. 7c.

At step S940, a second semiconductor device tier that includes second semiconductor devices can be formed over the insulator layer. For example, the second semiconductor device tier can include the second semiconductor device tier 652 of the semiconductor structure 600, which is formed over the insulator layer 690, as shown in FIGS. 6a and 6b. As another example, the second semiconductor device tier can include the top and bottom semiconductor device tiers TP and BM of the semiconductor structure 700, which are formed over the insulator layer 790, as shown in FIG. 7c. The second semiconductor device tier can be only processed and built once a second wafer of fresh Si is bonded to the first semiconductor device tier. In an embodiment, a second power rail can be formed over the second semiconductor device tier and provide power from a PDN to the second semiconductor device tier. For example, the second power rails 622 can be formed over the second semiconductor device tier 652 and electrically connect the second semiconductor device tier 652 to the second PDN 632 by way of the second TSVs (e.g., nano-scale) 642 to provide low voltage (Vss) and high voltage (VDD) power delivery, for example, from the second PDN 632 to the second semiconductor device tier 652, as shown in FIG. 6a. The second semiconductor devices can include FETs, which can be n-type or p-type and be arranged along the front side 690a of the insulator layer 690 or stacked vertically over one another along the thickness direction of the insulator layer 690.

At step S950, a second signal wiring structure (or a second wiring tier) can be formed over and electrically connected to the second semiconductor device tier. For example, the second wiring tier 662 can be formed over and electrically connected to the second semiconductor device tier 652 of the semiconductor structure 600, as shown in FIG. 6a. As another example, the first to third top wiring tracks 762a to 762c can be formed over and electrically connected to the top and bottom semiconductor device tiers TP and BM of the semiconductor structure 700, as shown in FIG. 7c.

At step S960, an inter-tier via can be formed vertically through the insulator layer to electrically connect the second signal wiring structure to the first signal wiring structure. For example, the monolithic inter-tier vias (MIVs) 670 can be formed vertically through the insulator layer 690 to electrically connect the second wiring tier 662 to the first wiring tier 661, as shown in FIGS. 6a and 6b. As another example, the monolithic inter-tier via (MIV) 770 can be formed vertically through the insulator layer 790 to electrically connect the third top wiring track 762c to the third bottom wiring track 761c, as shown in FIGS. 7a to 7c and 8a. In an embodiment, the inter-tier via can be formed in a diffusion break region that vertically isolates neighboring ones of the second semiconductor devices. For example, the MIVs 670 can be formed in the diffusion break region 653, which isolates neighboring semiconductor devices (e.g., CFETs) of the semiconductor structure 600, as shown in FIG. 6b. As another example, the MIV 770 can be formed in the diffusion break region 753 that vertically isolates neighboring semiconductor devices (e.g., CEFTs) of the top and bottom semiconductor device tiers TP and BM of the semiconductor structure 700, as shown in FIG. 7c. In another embodiment, the second semiconductor device tier can include a dummy poly, and the inter-tier via can be aligned with the dummy poly. For example, the top semiconductor device tier TP can include the left poly gate track 741, and the MIV 770 can be aligned with the left poly gate track 741, as shown in FIG. 7a. In an embodiment, a bottom source/drain contact (e.g., the bottom source/drain contact 783) and a bottom gate contact (e.g., the bottom gate contact 784) can be formed to electrically connect the source/drain region and gate region of a bottom semiconductor device tier of the second semiconductor device tier to bottom wiring tracks (e.g., the first and second bottom wiring tracks 761a and 761b), respectively. For example, the bottom source/drain contact and the bottom gate contact can be formed vertically through the insulator layer 790.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with some embodiments of the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. A multi-tier semiconductor structure, comprising:
   a first semiconductor device tier that includes first semiconductor devices;
   a first signal wiring structure formed over and electrically connected to the first semiconductor device tier;
   an insulator layer formed over the first signal wiring structure;
   a second semiconductor device tier formed over the insulator layer, the second semiconductor device tier including second semiconductor devices;
   a second signal wiring structure formed over and electrically connected to the second semiconductor device tier;
   a second power rail that is formed over and electrically connected to the second semiconductor device tier; and
   an inter-tier via formed vertically through the insulator layer and electrically connecting the second signal wiring structure to the first signal wiring structure, wherein the inter-tier via has two opposing ends that are in direct contact with the second signal wiring structure and the first signal wiring structure, respectively, the inter-tier via is electrically connected to a lower surface of the second signal wiring structure in a region that is above the second semiconductor device tier, and the second power rail does not horizontally overlap with the region.

2. The multi-tier semiconductor structure of claim 1, wherein the inter-tier via is formed in a diffusion break region that vertically isolates neighboring ones of the second semiconductor devices.

3. The multi-tier semiconductor structure of claim 2, wherein the second semiconductor device tier includes a dummy poly, and the inter-tier via is aligned with the dummy poly.

4. The multi-tier semiconductor structure of claim 1, further comprising a substrate, wherein the first semiconductor device tier is formed over the substrate.

5. The multi-tier semiconductor structure of claim 4, further comprising a first power rail that is buried in the substrate and electrically connected to the first semiconductor device tier.

6. The multi-tier semiconductor structure of claim 1, wherein the first semiconductor devices are vertically stacked over one another and/or the second semiconductor devices are vertically stacked over one another.

7. The multi-tier semiconductor structure of claim 6, wherein the second semiconductor devices include field effect transistors (FETs).

8. The multi-tier semiconductor structure of claim 1, wherein the first semiconductor device tier, the second semiconductor device tier and the inter-tier via are formed monolithically.

9. The multi-tier semiconductor structure of claim 1, further comprising a contact that is vertically formed to electrically connect the second semiconductor device tier to the second signal wiring structure.

10. The multi-tier semiconductor structure of claim 1, further comprising a contact that is formed vertically through the insulator layer to electrically connect the second semiconductor device tier to the first signal wiring structure.

11. The multi-tier semiconductor structure of claim 10, wherein the contact includes a gate contact that electrically connects a gate region of one of the second semiconductor devices of the second semiconductor device tier to the first signal wiring structure.

12. The multi-tier semiconductor structure of claim 10, wherein the contact includes a source/drain contact that electrically connects a source/drain region of one of the second semiconductor devices of the second semiconductor device tier to the first signal wiring structure.

13. The multi-tier semiconductor structure of claim 1, wherein the insulator layer includes a silicon-on-insulator (SoI) layer.

14. A method of fabricating a multi-tier semiconductor structure, the method comprising:

forming a first semiconductor device tier, the first semiconductor device tier including first semiconductor devices;

forming a first signal wiring structure over the first semiconductor device tier and electrically connecting the first signal wiring structure to the first semiconductor device tier;

forming an insulator layer over the first signal wiring structure;

forming a second semiconductor device tier over the insulator layer, the second semiconductor device tier including second semiconductor devices;

forming a second signal wiring structure over the second semiconductor device tier and electrically connecting the second signal wiring structure to the second semiconductor device tier; and forming an inter-tier via vertically through the insulator layer to electrically connect the second signal wiring structure to the first signal wiring structure, wherein the inter-tier via has two opposing ends that are in direct contact with the second signal wiring structure and the first signal wiring structure, respectively, the inter-tier via is electrically connected to a lower surface of the second signal wiring structure in a region that is above the second semiconductor device tier; and forming a second power rail over and electrically connecting the second power rail to the second semiconductor device tier, wherein the second power rail does not horizontally overlap with the region.

15. The method of claim 14, wherein forming an inter-tier via includes forming an inter-tier via in a diffusion break region that vertically isolates neighboring ones of the second semiconductor devices.

16. The method of claim 15, wherein the second semiconductor device tier includes a dummy poly, and the inter-tier via is aligned with the dummy poly.

17. The method of claim 14, wherein the first semiconductor device tier, the second semiconductor device tier and the inter-tier via are formed monolithically.

18. The method of claim 14, further comprising forming a contact vertically through the insulator layer to electrically connect the second semiconductor device tier to the first signal wiring structure.

* * * * *